US011145661B2

(12) United States Patent
Jin

(10) Patent No.: US 11,145,661 B2
(45) Date of Patent: Oct. 12, 2021

(54) STATIC RANDOM ACCESS MEMORY (SRAM) AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/875,231

(22) Filed: May 15, 2020

(65) Prior Publication Data

US 2020/0365599 A1 Nov. 19, 2020

(30) Foreign Application Priority Data

May 17, 2019 (CN) .......................... 201910414619.X

(51) Int. Cl.
*H01L 27/11* (2006.01)
(52) U.S. Cl.
CPC ................................ *H01L 27/1104* (2013.01)
(58) Field of Classification Search
CPC ............. H01L 27/1104; H01L 27/0924; H01L 21/823821; H01L 27/0207; H01L 27/1116
See application file for complete search history.

(56) References Cited

U.S. PATENT DOCUMENTS

| 10,056,390 B1* | 8/2018 | Liaw | H01L 21/823807 |
| 10,381,273 B1* | 8/2019 | Cheng | H01L 23/535 |
| 10,553,592 B2* | 2/2020 | Zhou | H01L 21/823814 |
| 10,847,521 B2* | 11/2020 | Huang | H01L 27/1104 |
| 2016/0117431 A1* | 4/2016 | Kim | H01L 27/11807 |
| | | | 716/119 |
| 2016/0343858 A1* | 11/2016 | Kim | H01L 21/823468 |
| 2016/0372476 A1* | 12/2016 | Hung | H01L 21/823871 |
| 2017/0338233 A1* | 11/2017 | Huang | H01L 27/1104 |
| 2020/0006354 A1* | 1/2020 | Wen | H01L 27/1104 |
| 2020/0357806 A1* | 11/2020 | Liaw | H01L 29/4966 |
| 2021/0098467 A1* | 4/2021 | Fujiwara | H01L 27/1104 |

* cited by examiner

*Primary Examiner* — Bac H Au
(74) *Attorney, Agent, or Firm* — Anova Law Group, PLLC

(57) ABSTRACT

Static random access memory (SRAM) and its forming method are provided. The forming method includes: providing a semiconductor substrate including memory cell regions, each memory cell region including a transmission region, a pull-down region and a pull-up region including a pull-up fin cutting region; forming first fins on the transmission region and the pull-down region; forming second initial fins on the pull-up region; forming initial gate structures across the first fins and the second initial fins; forming a dielectric layer on the semiconductor substrate, the first fins and the second initial fins; forming a mask layer on the dielectric layer and the initial gate structures; forming a first cutting layer in the initial gate structures at a bottom of the mask opening; and forming a second cutting layer on the pull-up fin cutting region in the dielectric layer at the bottom of the mask opening and in the second initial fins.

17 Claims, 14 Drawing Sheets

STATIC RANDOM ACCESS MEMORY (SRAM) AND FORMING METHOD THEREOF

CROSS-REFERENCES TO RELATED APPLICATIONS

This application claims priority of Chinese Patent Application No. 201910414619.X, filed on May 17, 2019, the entire contents of which are hereby incorporated by reference.

FIELD OF THE DISCLOSURE

The present disclosure generally relates to the field of semiconductor manufacturing and, more particularly, relates to a static random access memory (SRAM) and a forming method thereof.

BACKGROUND

With development of information technology, an amount of stored information has increased dramatically. An increase in the amount of stored information has promoted a rapid development of memory, and at a same time, has put forward higher requirements for stability of memory.

A basic SRAM relies on six transistors. The six transistors form two cross-coupled inverters. Each inverter includes a pull-up transistor, a pull-down transistor and an access transistor.

In order to obtain sufficient anti-interference ability and read stability, transistors configured to form a memory are mostly fin field-effect transistors (FinFETs). In a FinFET transistor, a gate is a 3D structure covering three surfaces of a fin, which can greatly improve circuit control. FinFET application in memory can improve data storage stability and integration of memory.

However, performance of existing SRAM memories needs to be improved.

BRIEF SUMMARY OF THE DISCLOSURE

One aspect of the present disclosure provides a forming method for a SRAM. The forming method includes: providing a semiconductor substrate including memory cell regions, each memory cell region including a transmission region, a pull-down region, a pull-up region including a pull-up fin cutting region; forming first fins on the transmission region and the pull-down region; forming second initial fins on the pull-up region; forming initial gate structures across the first fins and the second initial fins, the second initial fins extending to the pull-up fin cutting region; forming a dielectric layer covering sidewalls of the initial gate structures on the semiconductor substrate, the first fins and the second initial fins; forming a mask layer on the dielectric layer and the initial gate structures, the mask layer having a mask opening on the pull-up fin cutting region and extending from an extension direction of the second initial fins to the initial gate structures; forming a first cutting layer in the initial gate structures at a bottom of the mask opening, so that transmission gate structures and pull gate structures on both sides of the first cutting layer are formed from the initial gate structures, the transmission gate structures being on the transmission region; and forming a second cutting layer on the pull-up fin cutting region, and in the dielectric layer at the bottom of the mask opening and in the second initial fins, and forming second fins on a side of the second cutting layer from the second initial fins, the first cutting layer being on top surfaces of the second fins.

Another aspect of the present disclosure provides a SRAM. The SRAM includes a semiconductor substrate including memory cell regions, each cell region including a transmission region, a pull-down region, and a pull-up region including a pull-up fin cutting region; first fins on the transmission region and the pull-down region; second fins on the pull-up regions, the seconds fins being on a side of the pull-fin cutting regions in the extending direction of the second fins; transmission gate structures across the first fins, the transmission gate structures being on the transmission region; pull gate structures on the pull-down region and pull-up region; a first cutting layer between the transmission gate structures and the pull gate structures along the extension direction of the transmission gate structure, the first cutting layer spanning the second fins; and a second cutting layer on the pull-up fin cutting region, the second cutting layer being adjacent to sidewalls of the first fins along the extending direction of the first fins, the second cutting layer being adjacent to the first cutting layer.

Other aspects or embodiments of the present disclosure can be understood by those skilled in the art in light of the description, the claims, and the drawings of the present disclosure.

DETAILED DESCRIPTION

Figure 1:
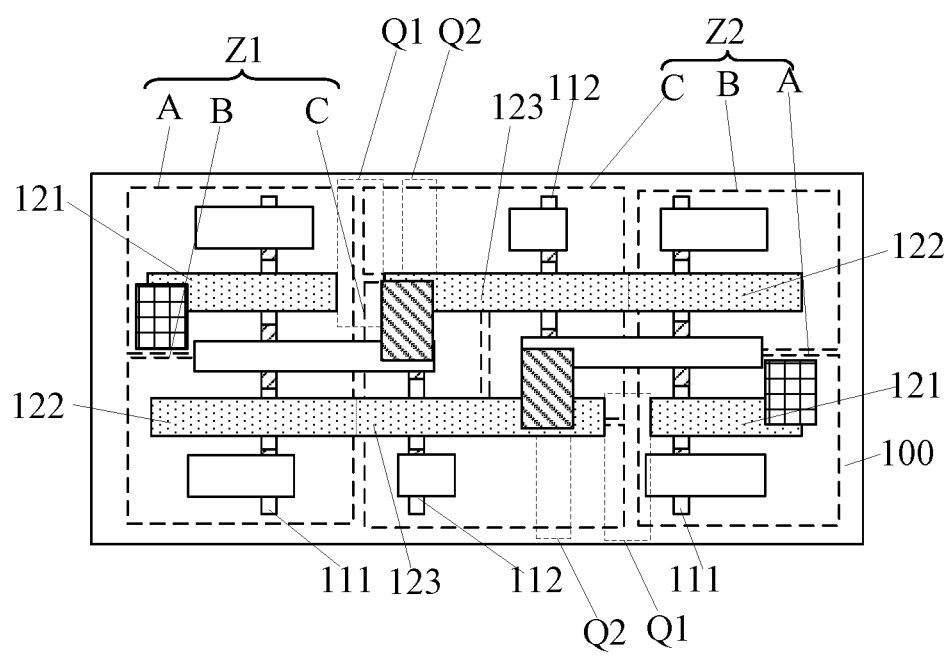
FIG. 1 illustrates a schematic diagram of a SRAM.

FIG. 1 illustrates a schematic diagram of a SRAM. The SRAM includes a substrate 100 including a first combination region $Z^1$ and a second combination region Z2 that is symmetrical to the center of the first combination region Z1, each of the first combination region Z1 and the second combination region Z2 including a transmission region A, a pull-down region B, and a pull-up region C; first fins 111 respectively on the transmission region A and the pull-down region B in the first combination region Z1 and on the transmission region A and the pull-down region B in the second combination region Z2; second fins 112 respectively on the pull-up region C of the first combination region Z1 and on the pull-up region C of the second combination region Z2; transmission gate structures 121 on the transmission region A of the substrate 100, the transmission gate structures 121 spanning the first fins 111 of the transmission region A; pull-down gate structures 122 on the pull-down region B of the substrate 100, the pull-down gate structures 122 spanning the first fins 111 of the pull-down region B; and pull-up gate structures 123 on the pull-up region C of the substrate 100, the pull-up gate structure 123 spanning the second fins 112.

The pull-up gate structure 123 and the pull-down gate structure 122 on the first combination region Z1 are connected together. The pull-up gate structure 123 and the pull-down gate structure 122 on the second combination region Z2 are connected together. A connected pull-up gate structure 123 and a pull-down gate structure 122 are collectively referred to as a pull gate structure. The pull gate structure of the first combination region Z1 and the transmission gate structure of the second combination region Z2 are disconnected. A first cutting layer Q1 is formed between the pull gate structure of the first combination region Z1 and the transmission gate structure of the second combination region Z2.

Since the first cutting layer Q1 is between the first fins of the transmission region and the second fins of the pull-up region C, the distance between the first cutting layer Q1 and the first fins is small. Therefore, a length of the corresponding transmission gate structure is small, the transmission gate structure is difficult to form. Specifically, a length of a dummy gate structure corresponding to a position of the transmission gate structure is small. It is difficult to remove the dummy gate structure corresponding to the position of the transmission gate structure, thereby reducing reliability of the transmission gate structure.

The second fins 112 of the first combination region Z1 need to be blocked so that the second fins 112 of the first combination region Z1 do not extend to the second combination region Z2. The second fins 112 of the second combination region Z2 needs to be blocked so that the second fins 112 of the second combination region Z2 do not extend to the first combination region Z1. A second cutting layer Q2 is formed on a side of the second fins 112, and the second cutting layer Q2 is configured to block the second fins 112.

Because the first cutting layer Q1 and the second cutting layer Q2 are separated from each other, and a distance between the first cutting layer Q1 and the second cutting layer Q2 is small, it is necessary to use different processes to separately form the first cutting layer Q1 and the second cutting layer Q2. A mask process is required to form the first cutting layer Q1, and another mask process is required to form the second cutting layer Q2, making the process steps redundant.

Since the second fins 112 are blocked first, and then the transmission gate structures 121 and the pull gate structures are formed, a positional deviation between the pull gate structures and the second fins 112 is large. Specifically, in an extending direction of a second fin 112, a size of an overlapping region between a pull gate structures and the second fin 112 is smaller than a size of the pull gate structure. For a source-drain layer on a side of a pull gate structure facing away from the second cutting layer Q2, forming the source-drain layer includes forming a recess in the second fins on the side of the pull gate structure facing away from the second cutting layer Q2, and growing the source-drain layer in the recess. Since a size of an overlapping region of a pull gate structure and a second fin 112 in an extending direction of the second fin 112 is smaller than a size of the pull gate structure, a material of a sidewall surface recessed toward the second cutting layer Q2 may not be a material of the second fin 112, a growth morphology of the source/drain layer is poor.

A forming method for a SRAM provided by the present disclosure includes: forming a mask layer on the dielectric layer and the initial gate structures, the mask layer having a mask opening, the mask opening being in the pull-up fin cutting region and extending from an extension direction of the second initial fins to the initial gate structures; forming a first cutting layer in the initial gate structures at a bottom of the mask opening, so that transmission gate structures and pull gate structures on both sides of the first cutting layer are formed from the initial gate structures, the transmission gate structures being on the transmission region; and forming a second cutting layer on the pull-up fin cutting region in the dielectric layer at a bottom of the mask opening and the second initial fins, so that the second fins on a side of the second cutting layer are formed from the second initial fins, the first cutting layer being on a top surface of the second fins. The method improves performance of SRAM memory, and simplify process steps.

In order to make the above objects, features, and advantages of the present disclosure more comprehensible, the following describes specific embodiments of the present disclosure in detail with reference to the accompanying drawings.

FIGS. 2-23 illustrates schematic diagrams of a SRAM forming process consistent with various disclosed embodiments of the present disclosure.

Figure 2:
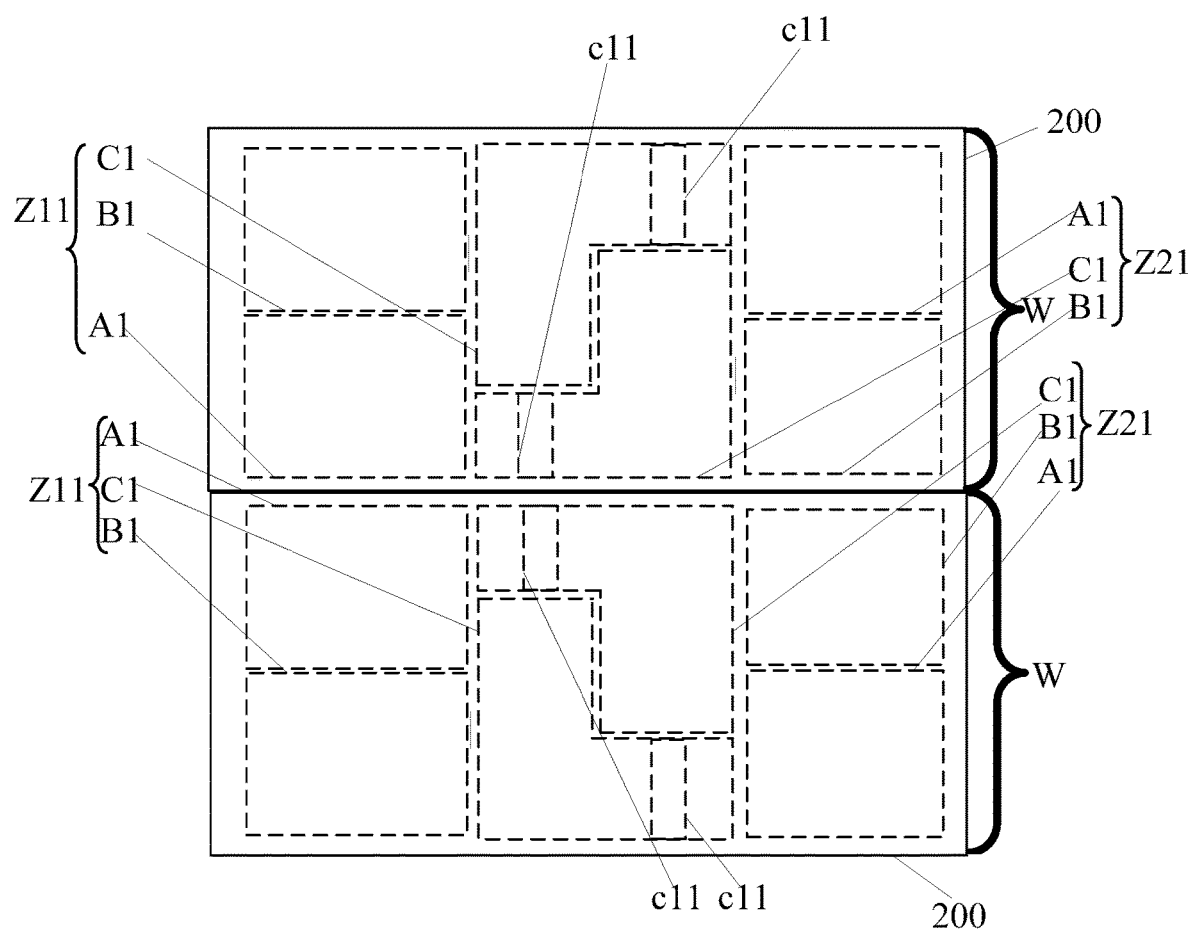
FIGS. 2-23 illustrates schematic diagrams of a SRAM forming process consistent with various disclosed embodiments of the present disclosure.

Referring to FIG. 2, a semiconductor substrate 200 is provided. The semiconductor substrate 200 includes memory cell regions W. The memory cell region W includes a transfer region A1, a pull-down region B1, and a pull-up region C1. The pull-up region C1 includes a pull-up fin cutting region c11.

The semiconductor substrate 200 provides a process platform for forming a SRAM test structure. A material of the semiconductor substrate 200 may be single crystal silicon, polysilicon, or amorphous silicon. The semiconductor substrate 200 may also be a semiconductor material such as silicon, germanium, silicon germanium, gallium arsenide, etc. In one embodiment, the material of the semiconductor substrate 200 is single crystal silicon.

The semiconductor substrate 200 includes a plurality of memory cell regions W. Each memory cell region W includes a first combination region Z11 and a second combination region Z21 that are symmetrical in the center. Each of the first combination region Z11 and the second combination region Z21 includes a transmission region A1, a pull-down region B1, and a pull-up region C1. The pull-up region C1 includes a pull-up fin cutting region c11. A positional relationship among the transmission region A1, the pull-down region B1, and the pull-up region C1 is distinguished according to a specific circuit design.

The transmission region A1 in the first combination region Z11 and the transmission region A1 in the second combination region Z21 are symmetrical in the center. The pull-down region B1 in the first combination region Z11 and the pull-down region B1 in the second combination region Z21 are symmetrical in the center. The pull-up region C1 in the first combination region Z11 and the pull-up region C1 in the second combination region Z21 are symmetrical in the center.

In one embodiment, the pull-up region C1 of the first combination region Z11 is between the pull-down region B1 of the first combination region Z11 and the transmission region A1 of the second combination region Z21. The pull-up region C1 of the second combination region Z21 is between the pull-down region B1 of the second combination region Z21 and the transmission region A1 of the first combination region Z1.

The transmission region A1 and the pull-down region B1 in the first combination region Z11 are arranged along a first direction. The transmission region A1 and the pull-down region B1 in the second combination region Z21 are arranged along the first direction. The pull-down region B1 and the pull-up region C1 in the first combination region Z11 are arranged along a second direction. The second direction is perpendicular to the first direction. The pull-down region B1 and the pull-up region C1 in the second combination region Z21 are arranged along the second direction. The pull-up fin cutting region c11 in the first combination region Z11 is on a side of the pull-up region C1 in the second combination region Z21 along the first direction. The pull-up fin cutting region c11 in the second combination region Z21 is on a side of the pull-up region C1 in the first combination region Z11 along the first direction. The pull-up fin cutting region c11 in the first combination region Z11 and the pull-up fin cutting region c11 in the second combination region Z21 are symmetrical in the center.

In one embodiment, two memory cell regions W are taken as an example. In other embodiments, number of the memory cell regions W is one or more than three.

The transmission region A1 is configured to form transmission transistors. The pull-down region B1 is configured to form pull-down transistors. The pull-up region C1 is configured to form pull-up transistors.

The transmission transistors include first transfer transistors and second transfer transistors. The pull-down transistors include first pull-down transistors and second pull-down transistors. The pull-up transistors include first pull-up transistors and second pull-up transistors.

The transmission region A1 in the first combination region Z11 is configured to form the first transmission transistors. The transmission region A1 in the second combination region Z21 is configured to form the second transmission transistors. The pull-down region B1 in the first combination region Z11 is configured to form the first pull-down transistors. The pull-down region B1 in the second combination region Z21 is configured to form the second pull-down transistors. The pull-up region C1 in the first combination region Z11 is configured to form the first pull-up transistors. The pull-up region C1 in the second combination region Z21 is configured to form the second pull-up transistors.

In one embodiment, a type of the transfer transistors and the pull-down transistors is N-type, and a type of the pull-up transistors is P-type.

The pull-up fin cutting region c11 is configured to form a second cutting layer.

In one embodiment, an arrangement direction of the adjacent memory cell regions W is parallel to an arrangement direction of the transmission region A1 to the pull-down region B1 in the first combination region Z11.

For adjacent memory cell regions W, the adjacent memory cell regions W are mirror-symmetric. The pull-up fin cutting regions c11 of the adjacent memory cell regions W are adjacent to each other.

Figure 3:
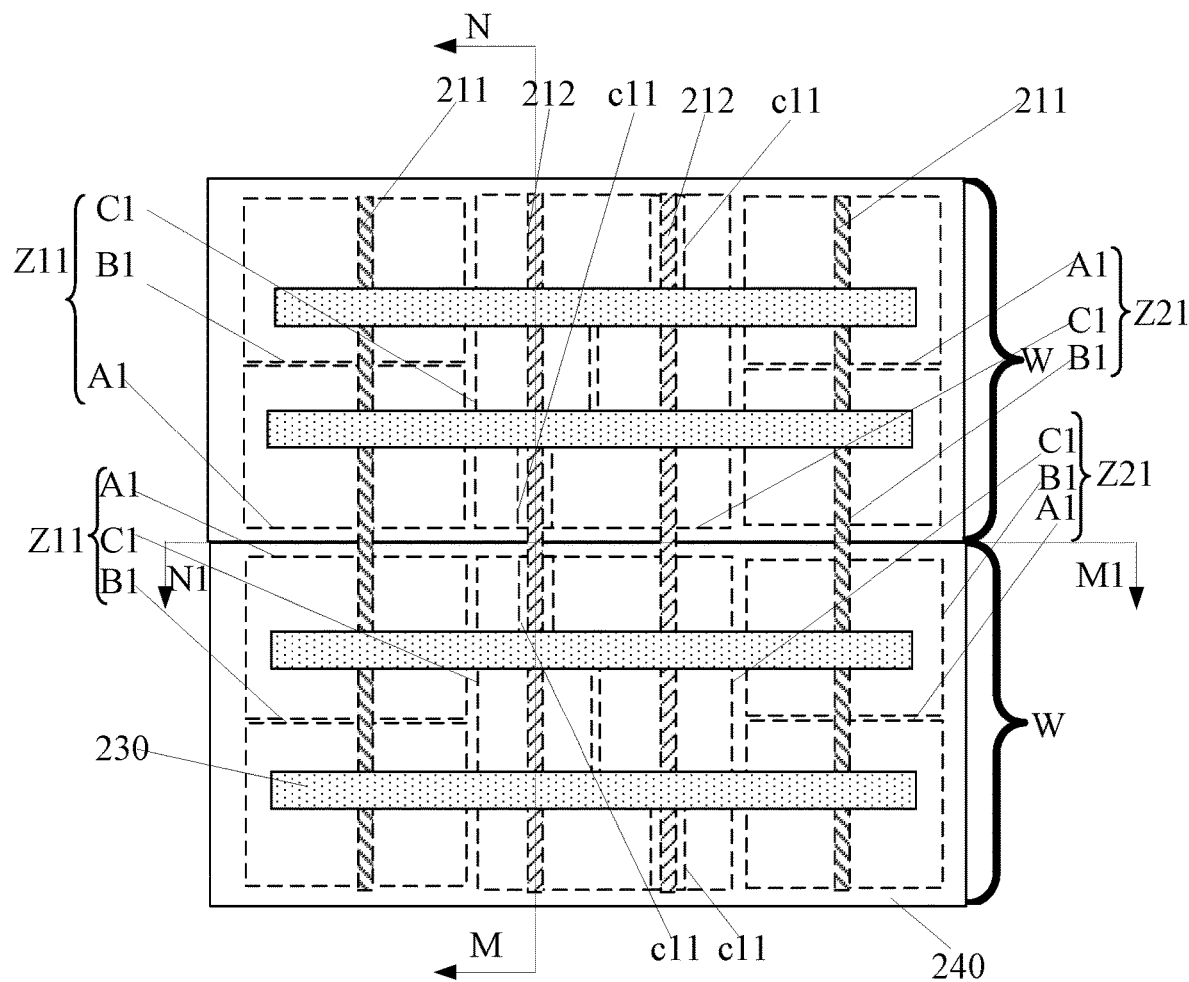
Figure 4:
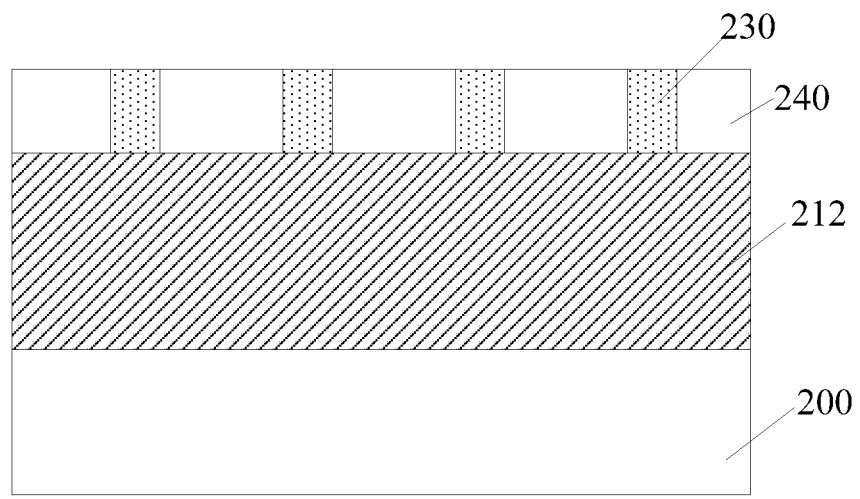
Figure 5:
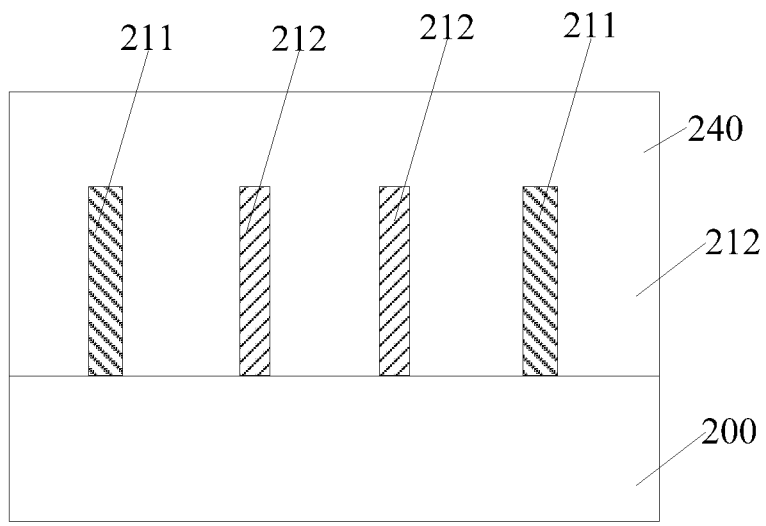

With reference to FIGS. 3, 4 and 5, FIG. 3 is a schematic diagram based on FIG. 2, FIG. 4 is a cross-sectional view taken along a cutting line NM in FIG. 3, and FIG. 5 is a cross-sectional view taken along a cutting line N1-M1 in FIG. 3. The first fins 211 are formed on the transmission region A1 and the pull-down region B1. The second initial fins 212 are formed on the pull-up region C1. The second initial fins 212 extend to the pull-up fin cutting region c11. Initial gate structures 230 are formed across the first fins 211 and the second initial fins 212. The pull-up fin cutting region c11 is on sides of the initial gate structures 230. A dielectric layer 240 is formed on the semiconductor substrate 200, the first fins 211, and the second initial fins 212 to cover sidewalls of the initial gate structures 230.

Specifically, the first fins 211 are respectively formed on the transmission region A1 and the pull-down region B1 of the first combination region Z11, and on the transmission region A1 and the pull-down region B1 of the second combination region Z21. The second initial fins 212 are respectively formed on the pull-up region C1 of the first combination region Z11 and on the pull-up region C1 of the second combination region Z21. The second initial fins 212 of the first combination region Z11 extend to the pull-up fin cutting region c11 of the second combination region Z21.

The second initial fins 212 of the second combination region Z21 extend to the pull-up fin cutting region c11 of the first combination region Z11.

There are two second initial fins 212 on one memory cell region W.

An extending direction of the first fins 211 is parallel to an extending direction of the second initial fins 212.

The first fins 211 of adjacent memory cell regions W are connected together. The second initial fins 212 of adjacent memory cell regions W are connected together. Subsequently, the second initial fins 212 of the adjacent memory cell region W need to be disconnected.

An extending direction of the initial gate structures 230 is perpendicular to an extending direction of the first fins 211 and an extending direction of the second initial fins 212.

There are two initial gate structures 230 on one memory cell region W. One initial gate structure 230 spans the first fins 211 on the transmission region A1 in the first combination region Z11, the second initial fins 212 on the pull-up region C1 in the second combination region Z21, and the first fins 211 on the pull-down region B1 in the second combination region Z21. The other initial gate structure 230 spans the first fins 211 on the transmission region A1 in the second combination region Z21, the second initial fins 212 on the pull-up region C1 in the first combination region Z11, and the first fins 211 on the pull-down region B1 in the first combination region Z11. The arrangement direction of the two initial gate structures 230 is perpendicular to an extending direction of the initial gate structures 230.

A material of the dielectric layer 240 includes silicon oxide or a low-K (K 3.9 or less) dielectric material.

In one embodiment, the forming method for the SRAM memory further includes: before the dielectric layer 240 is formed, forming first source-drain doped regions (not shown) respectively in the first fins on both sides of the initial gate structures, and forming second source-drain doped region (not shown) respectively in the second initial fins on both sides of the initial gate structures.

Figure 6:
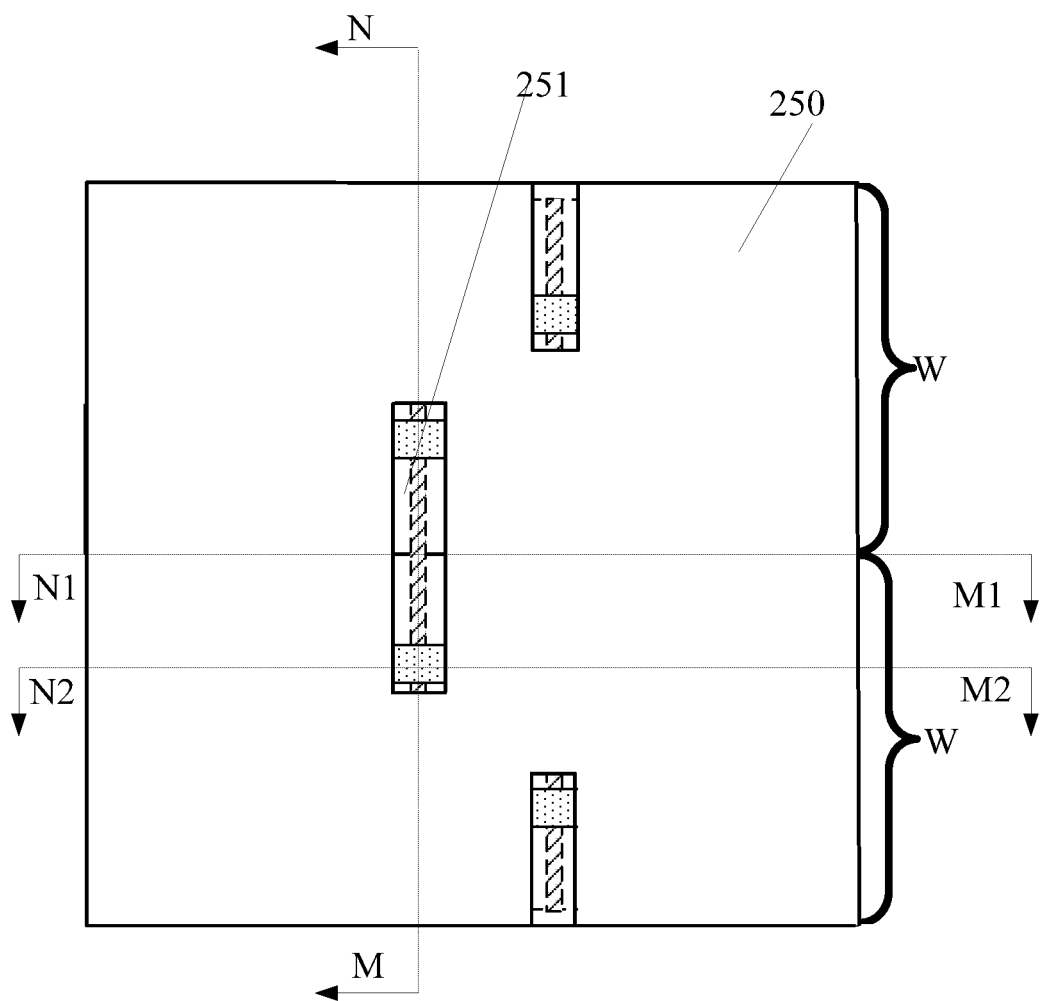
Figure 7:
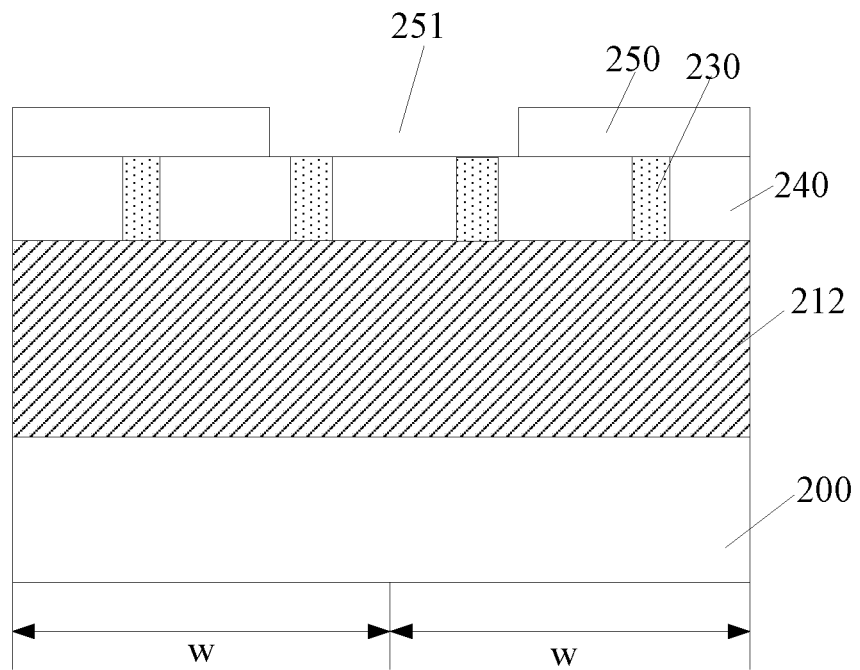
Figure 8:
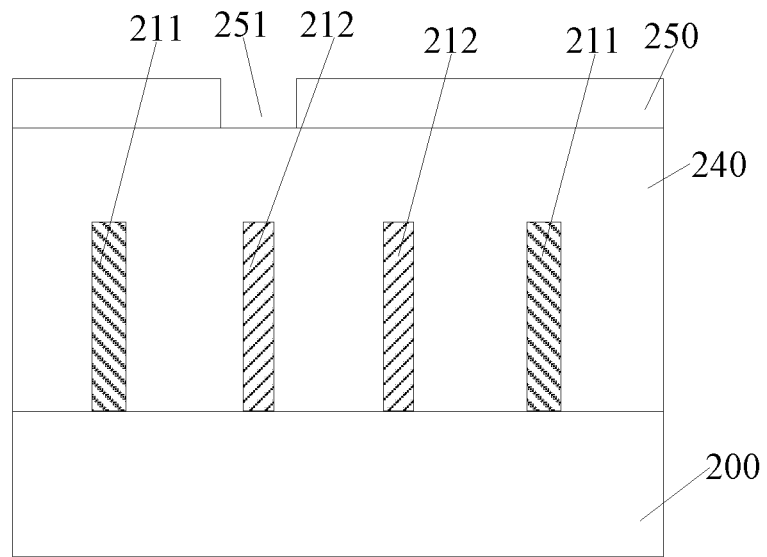
Figure 9:
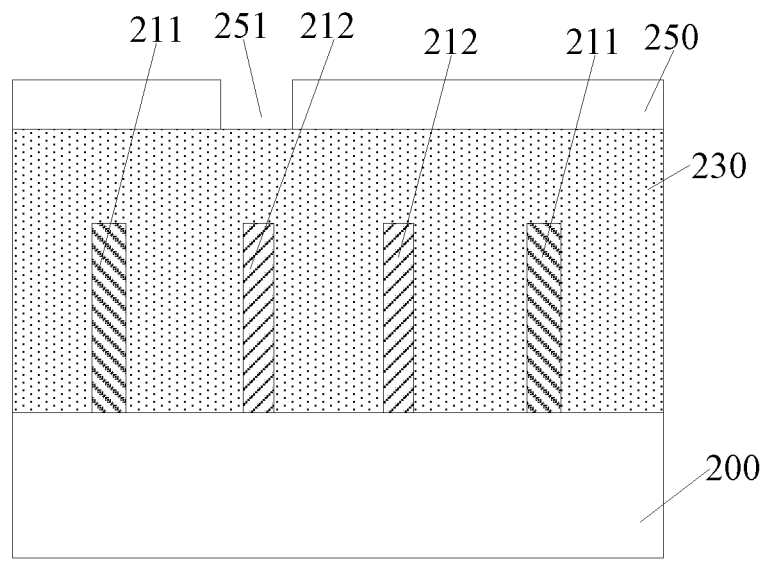

Referring to FIGS. 6, 7, 8 and 9, FIG. 6 is a schematic diagram based on FIG. 3, FIG. 7 is a schematic diagram based on FIG. 4, FIG. 8 is a schematic diagram based on FIG. 5, FIG. 6 is a sectional view taken along a cutting line NM, FIG. 8 is a sectional view taken along a cutting line N1-M1 in FIG. 6, and FIG. 9 is a sectional view taken along a cutting line N2-M2 in FIG. 6. A mask layer 250 is formed on the dielectric layer 240 and the initial gate structures 230. The mask layer 250 has a mask opening 251. The mask opening 251 is on the pull-up fin cutting region c11 and extends from the second initial fins 212 to the initial gate structures 230.

A material of the mask layer 250 and a material of the dielectric layer 240 are different. A material of the mask layer 250 and a material of the initial gate structures 230 are different.

A material of the mask layer 250 includes photoresist.

The mask opening 251 is configured to define positions of the first cutting layer and the second cutting layer. The mask opening 251 penetrates the mask layer 250.

Along an extending direction of the second initial fins 212, a size of an overlapping region of the mask opening 251 and an initial gate structure 230 is equal to a width of the initial gate structure 230. The mask opening 251 may also expose part of the dielectric layer 240 on sides of the initial gate structures 230 facing away from the pull-up fin cutting region c11.

A first cutting layer is formed in the initial gate structures at a bottom of the mask opening, so that transmission gate structures and pull gate structures on both sides of the first cutting layer are formed from the initial gate structures. A second cutting layer on the pull-up fin cutting region is formed in the dielectric layer at a bottom of the mask opening and the second initial fins. second fins on a side of the second cutting layer are formed from the second initial fins. The first cutting layer is on a top surface of the second fins.

The forming method for the first cutting layer includes: etching to remove the initial gate structures at a bottom of the mask opening; forming a first cutting opening in the initial gate structures; exposing part of top surfaces of the second initial fins at a bottom of the first cutting opening and forming transmission gate structures and pull gate structures on both sides of the first cutting opening from the initial gate structures; and forming a first cutting layer in the first cutting opening.

The forming method for the SRAM memory further includes: when forming the first dicing layer, forming a mask sidewall on a sidewall of the mask opening, and in the extending direction of the second initial fins, a minimum distance between the mask sidewall and the first cutting layer being equal to zero.

The forming method for the first cutting layer and the mask sidewall includes: forming a first cutting film in the first cutting opening, and on a sidewall and at a bottom of the mask opening; etching back the first cutting film to form the first cutting layer and the mask sidewall.

In one embodiment, after the first cutting layer is formed, a formation of the second cutting layer is described as an example.

In other embodiments, after the second cutting layer is formed, a first cutting layer is formed.

A forming method for the second cutting layer includes: etching the dielectric layer and the second initial fins at a bottom of the mask opening by using the first cutting layer and the mask layer as masks, forming a second cutting opening on the pull-up fin cutting region in the second initial fins and the dielectric layer; the second cutting opening cutting the second initial fins in an extending direction of the second initial fins, the second initial fins being formed on a side of the second cutting opening. and forming the second cutting layer in the second cutting opening.

Figure 10:
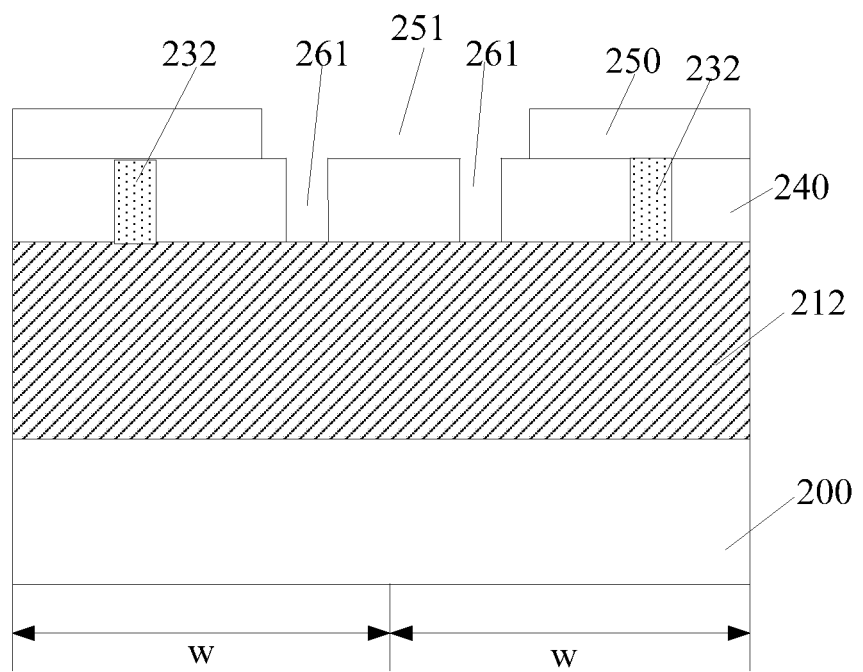
Figure 11:
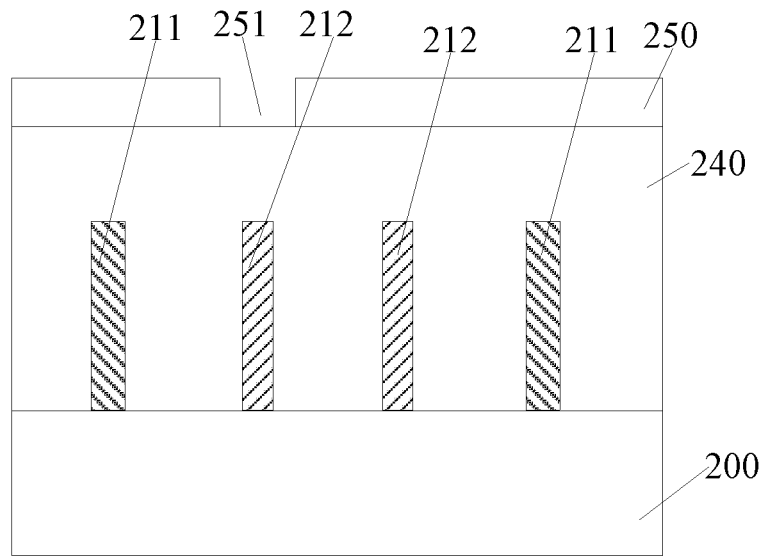
Figure 12:
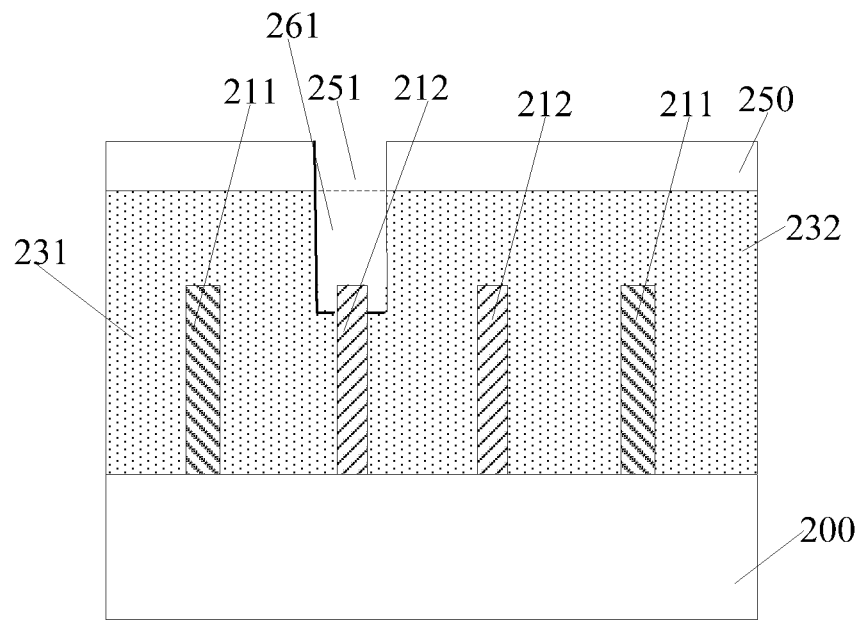

Referring to FIGS. 10, 11 and 12, FIG. 10 is a schematic diagram based on FIG. 7, FIG. 11 is a schematic diagram based on FIG. 8, and FIG. 12 is a schematic diagram based on FIG. 9. The initial gate structures 230 at a bottom of the mask opening 251 is removed by etching, and a first cutting opening 261 is formed in the initial gate structures 230. Bottom of the first cutting opening 261 exposes part of top surface of the second initial fins 212. Transmission gate structures 231 and pull gate structures 232 on both sides of the first cutting opening 261 are formed from the initial gate structures 230.

The first cutting opening 261 cuts off the initial gate structures 230 in the extending direction of the initial gate structures 230. The transmission gate structures 231 and the pull gate structures 232 on both sides of the first cut opening 261 are formed from the initial gate structures 230.

The transmission gate structures 231 are respectively on the transmission region A1 of the first combination region Z11 and the transmission region A1 of the second combination region Z21. The pull gate structures 232 are respectively on the pull-down regions B1 and the pull-up region C1 of the first combination region Z11, and on the pull-down region B1 and the pull-up region C1 of the second combination region Z21.

For the transmission gate structures 231 and the pull gate structures 232 on both sides of the first cutting opening 261, the transmission gate structures 231 are on the transmission region A1 of the first combination region Z11 and the pull gate structures 232 are on the pull-down region B1 and the pull-up region C1 of the second combination region Z2. Alternatively, the transmission gate structures 231 are on the transmission region A1 of the second combination region Z21 and the pull gate structures 232 are on the pull-down region B1 and the pull-up region C1 of the first combination region Z11. That is, for part of the transmission gate structures 231 and the pull gate structures 232 on both sides of the first cutting opening 261, the transmission gate structures 231 are on the transmission region A1 of the first combination region Z11 and the pull gate structures 232 are on the pull-down region B1 and pull-up region C1 of the second combination region Z21. For part of the transmission gate structures 231 and the pull gate structures 232 on both sides of the first cutting opening 261, the transmission gate structures 231 are on the transmission region A1 of the second combination region Z11 and the pull gate structures 232 are on the pull-down region B1 and pull-up region C1 of the first combination region Z21.

Figure 13:
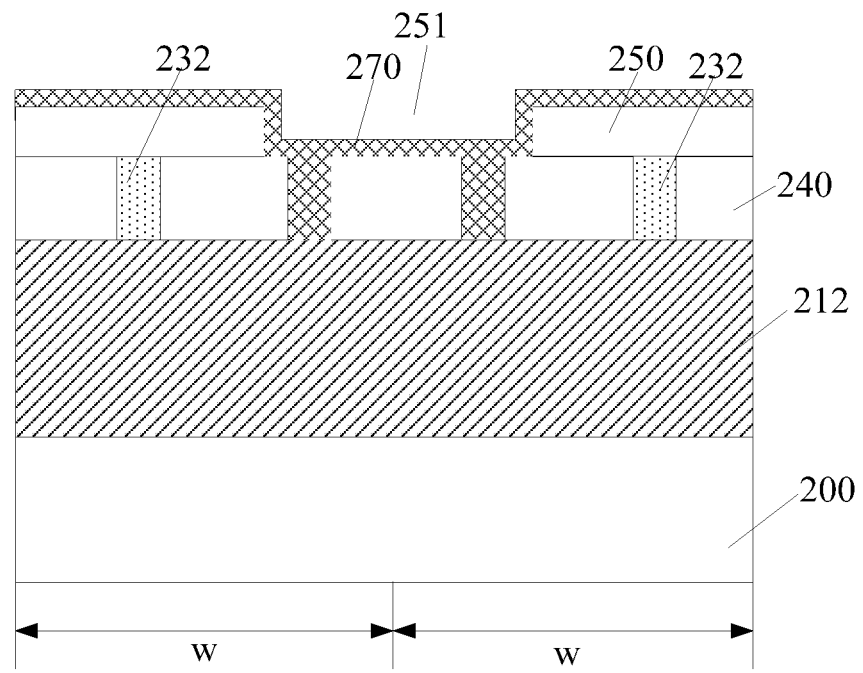
Figure 14:
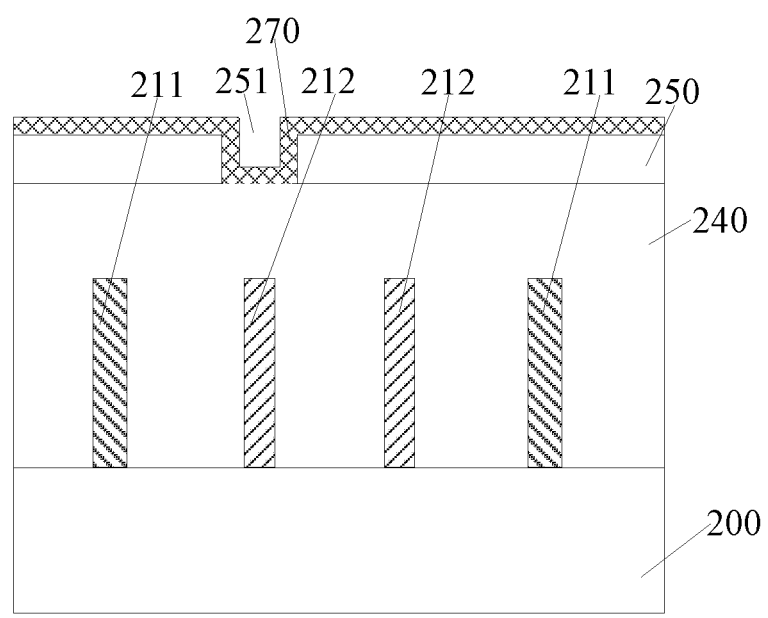
Figure 15:
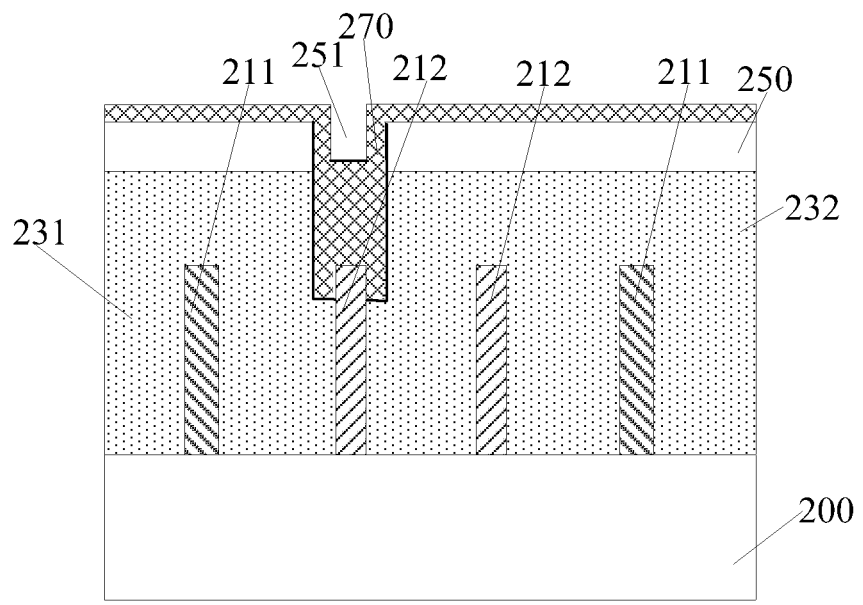

Referring to FIGS. 13, 14 and 15, FIG. 13 is a schematic diagram based on FIG. 10, FIG. 14 is a schematic diagram based on FIG. 11, and FIG. 15 is a schematic diagram based on FIG. 12. A first cutting film 270 is formed in the first cutting opening 261 and on a sidewall and at a bottom of the mask opening 251.

The process of forming the first cutting film 270 is a deposition process, such as an atomic layer deposition process.

A material of the first cutting film 270 includes silicon nitride, aluminum oxide, silicon carbide, aluminum nitride, or a combination thereof.

A material of the first dicing film 270 and a material of the dielectric layer 240 are different.

A first cutting film 270 fills the first cutting opening 261.

Figure 16:
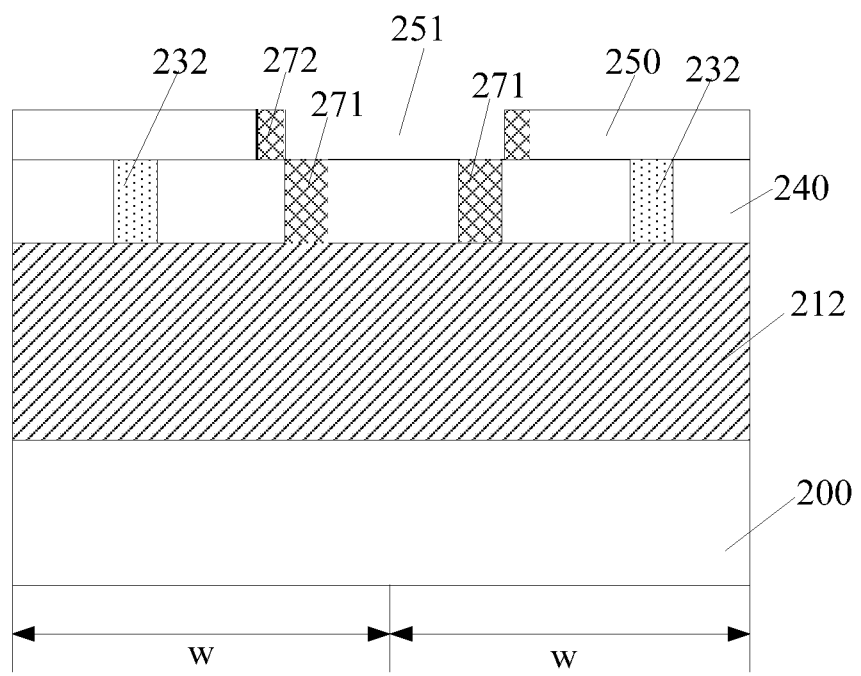
Figure 17:
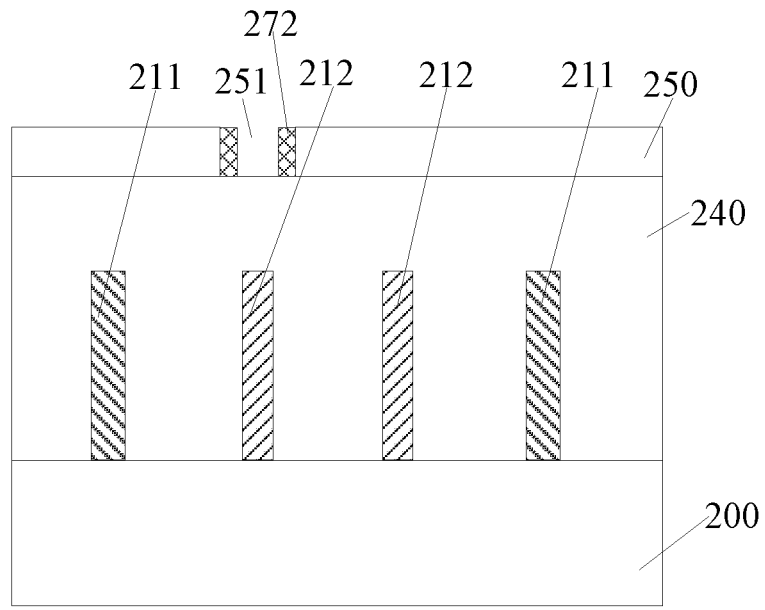
Figure 18:
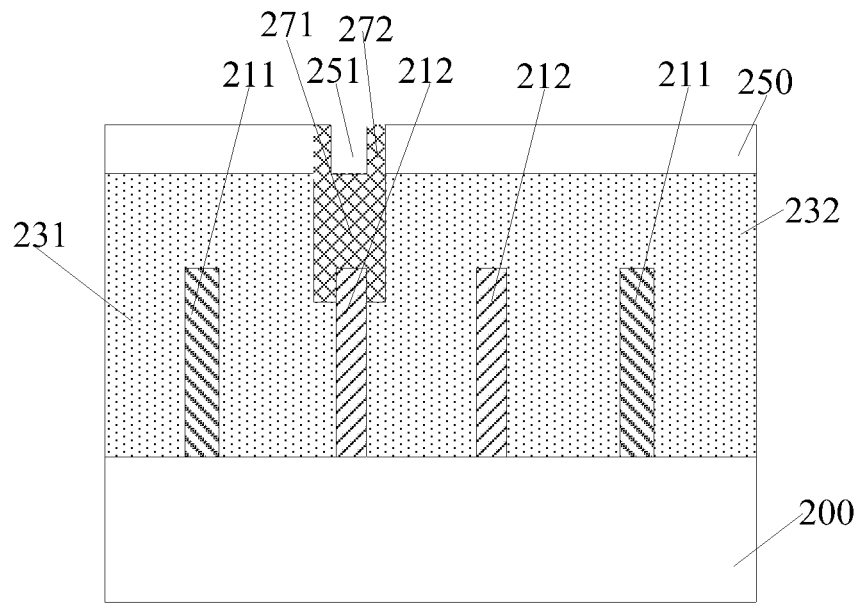

Referring to FIGS. 16, 17 and 18, FIG. 16 is a schematic diagram based on FIG. 13, FIG. 17 is a schematic diagram based on FIG. 14, and FIG. 18 is a schematic diagram based on FIG. 15. The first cutting film 270 is etched back to form a first cutting layer 271 and a mask sidewall 272.

The mask sidewall 272 is on a sidewall of the mask opening 251.

Functions of the mask sidewall 272 include: in an extending direction of the second initial fins, the minimum distance between the mask sidewall and the first cutting layer is equal to zero. While the mask opening exposes the dielectric layer of the mask opening on both sides of the second initial fins 212, the mask sidewall completely covers the dielectric layer at a bottom of the mask opening on a side of the second initial fins 212 facing away from pull-up fin cutting region c11, so as to avoid etching the dielectric layer at the bottom of the mask opening on the side of the second initial fins 212 facing away from the pull-up fin cutting region c11.

The first cutting layer 271 is in the first cutting opening 261, and the first cutting layer 271 is on a top surface of the second initial fins 212. After the second fins are subsequently formed, the first cutting layer 271 is on top surfaces of the second fins.

The first cutting layer 271 is between the transmission gate structure 231 of the first combination region Z11 and the pull gate structure 232 of the second combination region Z21, and between the transmission gate structure 231 in the second combined region Z21 and the pull gate structure 232 in the first combined region Z11.

Figure 19:
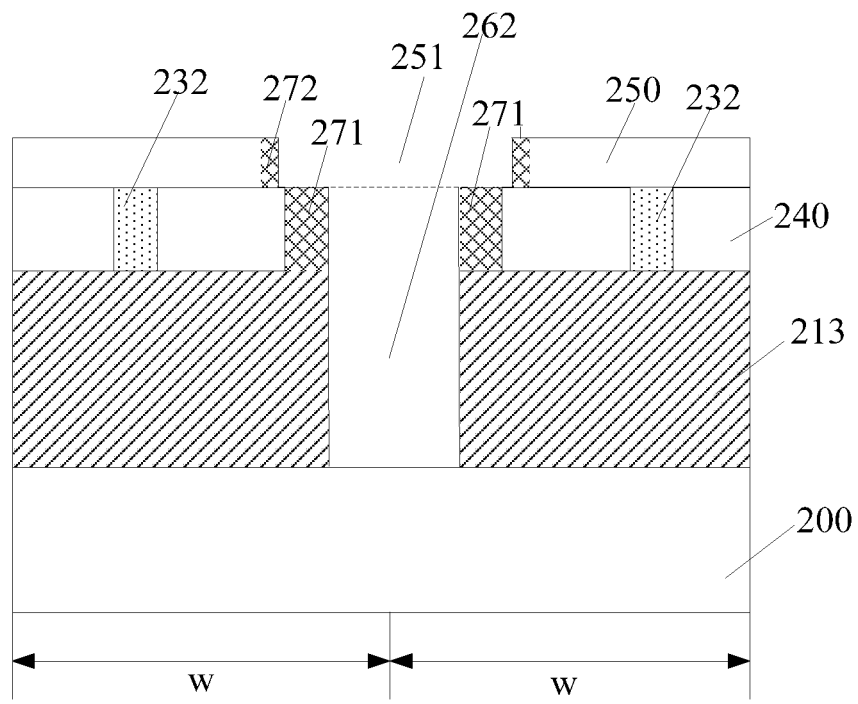
Figure 20:
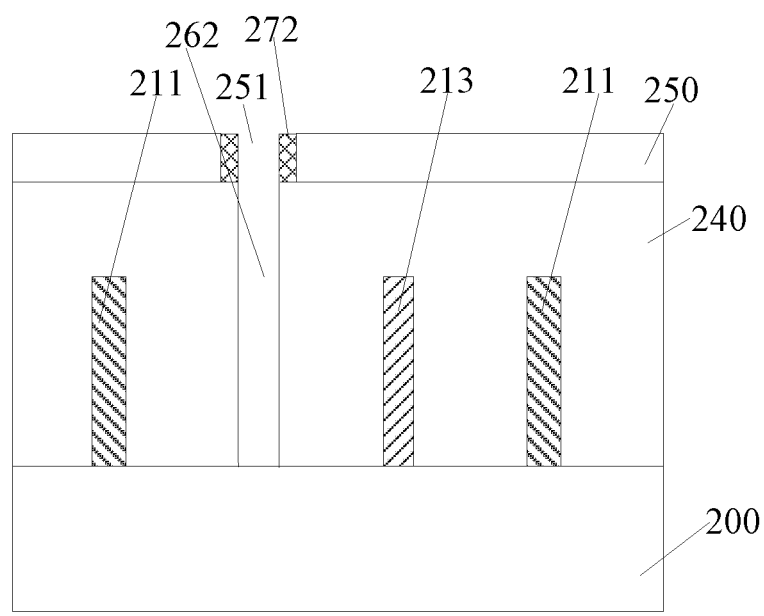

Referring to FIGS. 19 and 20, FIG. 19 is a schematic diagram based on FIG. 16, and FIG. 20 is a schematic diagram based on FIG. 17. By using the first cutting layer 271 and the mask layer 250 as masks, the dielectric layer 240 and the second initial fins 212 at a bottom of the mask opening 251 are removed by etching. A second cutting opening 262 on the pull-up fin cutting region c11 is formed in the second initial fins 212 and the dielectric layer 240. The second cutting opening 262 cuts the second initial fins 212 in the extending direction of the second initial fins 212, so that second fins 213 on a side of the second cutting opening 262 are formed from the second initial fins 212.

The first cutting layer 271 is on a top surface of the second fins 213.

The second fins 213 are respectively on the pull-up region C1 of the first combination region Z11 and on the pull-up region C1 of the second combination region Z21. The second fins 213 of the first combination region Z11 are on a side of the pull-up fin cutting region c11 of the second combination region Z21 in the extending direction of the second fins 213. The second fins 213 of the second combination region Z21 are on a side of the pull-up fin cutting region c11 of the first combination region Z11 in the extending direction of the second fins 213.

A size of the first cutting layer 271 in an extending direction of a pull gate structure 232 is 100% to 110% of a width of a top surface of a second fin 213. A width of an overlapping region of the first cutting layer 271 and the top surface of the second fin 213 is equal to the width of the top surface of the second fin 213. The width of the overlapping region of the first cutting layer 271 and the top surface of the second fin 213 refers to a size in a width direction of the second fin 213.

Figure 21:
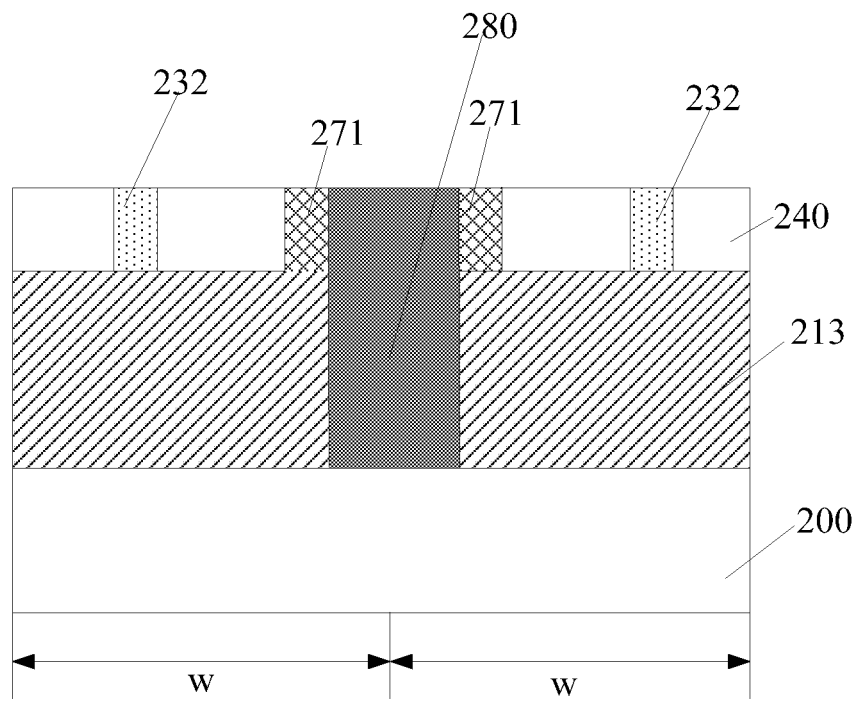
Figure 22:
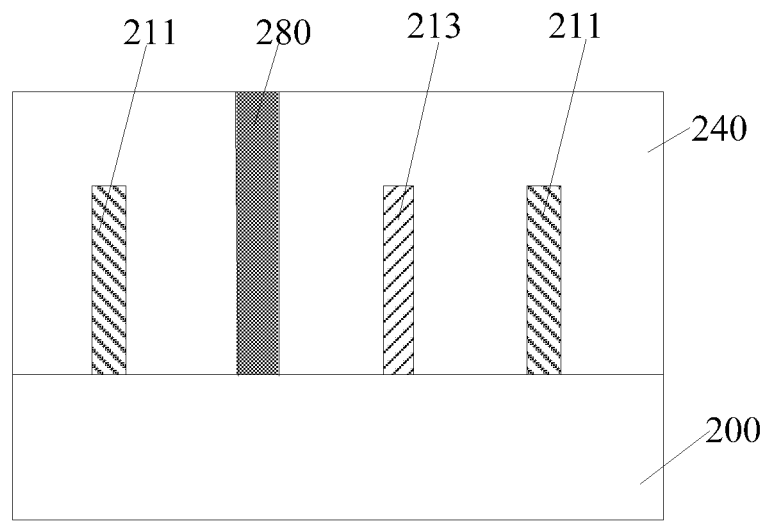
Figure 23:
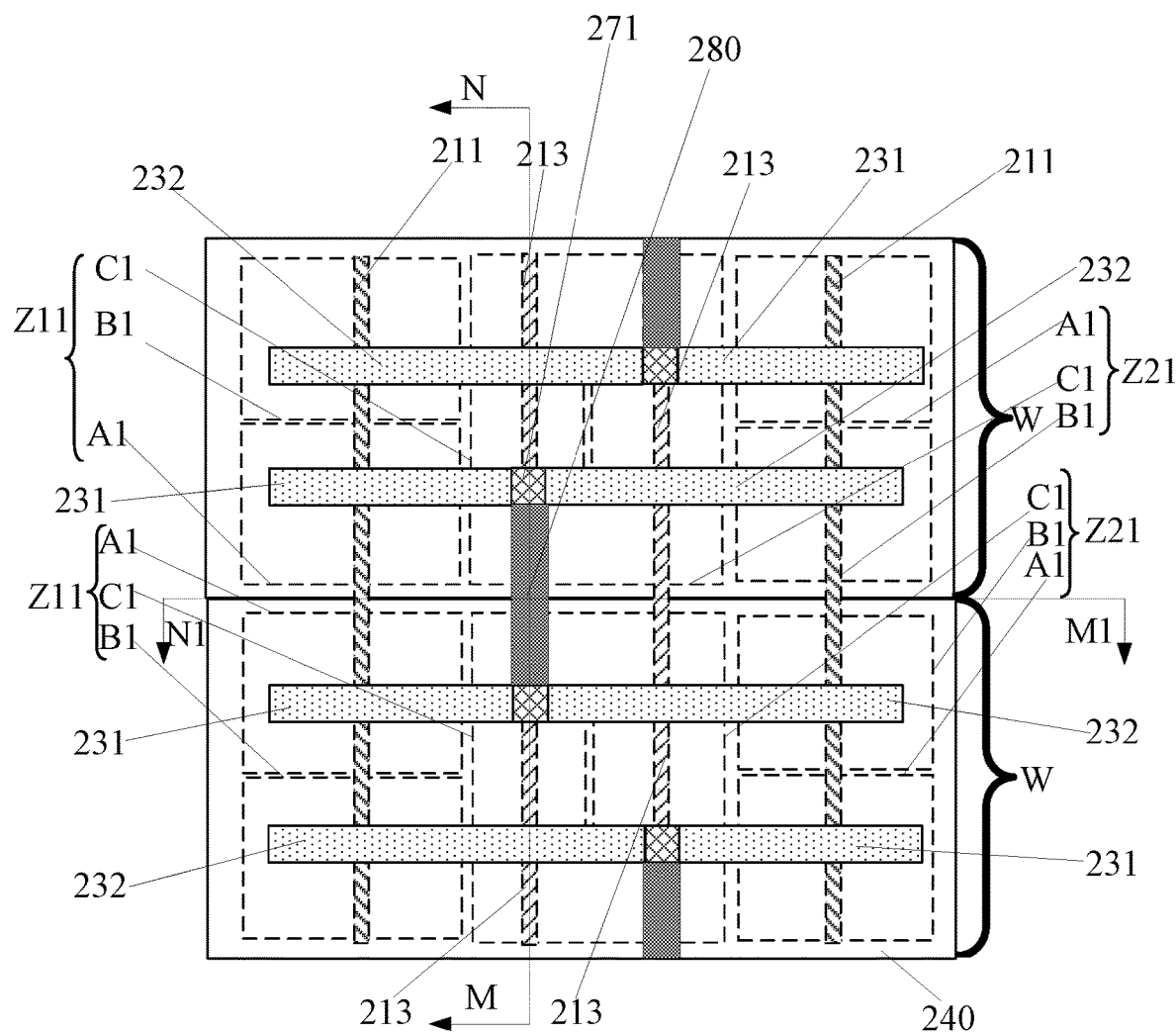

Referring to FIGS. 21, 22, and 23, FIG. 21 is a schematic diagram based on FIG. 19, FIG. 22 is a schematic diagram based on FIG. 20, FIG. 23 is a plan view corresponding to FIG. 21 and FIG. 23, and FIG. A cross-sectional view of a cutting line NM in 23, and FIG. 22 is a cross-sectional view of a cutting line N1-M1 in FIG. 23. After the mask layer 250 and the mask sidewall 272 are removed, a second cutting layer 280 is formed in the second cutting opening 262.

A material of the second cutting layer 280 includes silicon nitride, aluminum oxide, silicon carbide, aluminum nitride, silicon oxide, or a combination thereof.

A material of the second cutting layer 280 and a material of the dielectric layer 240 are the same or different.

A forming method for the second cutting layer 280 includes: forming a second cutting film in the second cutting opening 262, the dielectric layer 240, the first cutting layer 271, the transmission gate structures 231, and the pull gate structures 232; and planarizing the second cutting film until a top surface of the dielectric layer 240 is exposed to form the second cutting layer 280.

The second cutting layer 280 is respectively on the pull-up fin cutting region c11 of the first combination region Z11 and the pull-up fin cutting region c11 of the second combination region Z21.

Correspondingly, the present disclosure provides a SRAM formed by using the above method. Referring to FIG. 21, FIG. 22, and FIG. 23, the SRAM includes: a semiconductor substrate 200 including memory cell regions W, the memory cell region including a transmission region A1, a pull-down region B1, and a pull-up region C1 including a pull-up fin cutting region c11; first fins 211 on the transmission region A1 and the pull-down region B1; second fins 213 on the pull-up region C1, the second fins 213 being on a side of the pull-up fin cutting region c11 in an extending direction of the second fins 213; transmission gate structures 231 across the first fins 211, the transmission gate structures 231 being on the transmission region A1; pull gate structures 232 on a pull-down region B1 and the pull-up region C1; a first cutting layer 271 between the transmission gate structures 231 and the pull gate structures 232 along the extension direction of the transmission gate structures 231, the first cutting layer 271 spanning the second fins 213; and a second cutting layer 280 on the pull-up fin cutting region c11, the second cutting layer 280 being adjacent to sidewalls of the first fins 211 along an extending direction of the first fins 211, the second cutting layer 280 being adjacent to the first cutting layer 271.

Each memory cell region W includes a first combination region Z11 and a second combination region Z21 which are symmetrical in the center. Each of the first combination region Z11 and the second combination region Z21 includes a transmission region A1, a pull-down region B1, and a pull-up region C1. The first fins 211 are respectively on the transmission region A1 and the pull-down region B1 of the first combination region Z11 and on the transmission region A1 and the pull-down region B1 of the second combination region Z21. The second fins 213 are respectively on the pull-up region C1 of the first combined region Z11 and the pull-up region C1 of the second combined region Z21, the second fins 213 of the first combination region Z11 being on a side of the pull-up fin cutting region c11 of the second combination region Z21 in the extending direction of the second fins 213, and the second fins 213 of the second combination region Z21 being on a side of the pull-up fin cutting region c11 of the first combination region Z11 in the extending direction of the second fins 21. The transmission gate structures 231 are on the transmission region A1 of the first combination region Z11 and on the transmission region A1 of the second combination region Z21. The pull gate structures 232 are on the pull-down region B1 and the pull-up region C1 of the first combination region Z11, and on the pull-down region B1 and the pull-up region C1 of the second combination region Z21. The first cutting layer 271 is respectively between the transmission gate structure 231 of the first combination region Z11 and the pull gate structure 232 of the second combination region Z21, and between the transmission gate structure 231 in the second combined region Z21 and the pull gate structure 232 in the first combined region Z11. The second cutting layer 280 is respectively on the pull-up fin cutting region c11 of the first combination region Z11 and the pull-up fin cutting region c11 of the second combination region Z21.

A material of the first cutting layer 271 includes silicon nitride, aluminum oxide, silicon carbide, aluminum nitride, or a combination thereof.

A material of the second cutting layer 280 includes silicon nitride, aluminum oxide, silicon carbide, aluminum nitride, silicon oxide, or a combination thereof.

In an extending direction of a second fin 213, a size of an overlapping region of the first cutting layer 271 and the second fin 213 is equal to a size of the first cutting layer 271.

Although the present disclosure is disclosed as above, but not limited thereto. Those skilled in the art can make various changes and modifications without departing from the spirit and scope of the present disclosure. The protection scope of the present disclosure shall be subject to the scope defined by the claims.

What is claimed is:

1. A forming method for a static random access memory (SRAM), comprising:

providing a semiconductor substrate including memory cell regions, each memory cell region including a transmission region, a pull-down region, and a pull-up region including a pull-up fin cutting region;

forming first fins on the transmission region and the pull-down region;

forming second initial fins on the pull-up region, the second initial fins extending to the pull-up fin cutting region;

forming initial gate structures across the first fins and the second initial fins, the pull-up fin cutting region being on a side of the initial gate structures;

forming a dielectric layer covering sidewalls of the initial gate structures on the semiconductor substrate, the first fins and the second initial fins;

forming a mask layer on the dielectric layer and the initial gate structures, the mask layer having a mask opening on the pull-up fin cutting region and extending from an extension direction of the second initial fins to the initial gate structures;

forming a first cutting layer in the initial gate structures at a bottom of the mask opening, so that transmission gate structures and pull gate structures on both sides of the first cutting layer are formed from the initial gate structures, the transmission gate structures being on the transmission region; and forming a second cutting layer on the pull-up fin cutting region, and in the dielectric layer at the bottom of the mask opening and in the second initial fins, and forming second fins on a side of the second cutting layer from the second initial fins, the first cutting layer being on top surfaces of the second fins.

2. The method according to claim 1, wherein:

each memory cell region includes a first combination region and a second combination region that are symmetrical in the center, each of the first combination region and the second combination region includes a transmission region, a pull-down region, and a pull-up region;

the first fins are respectively on the transmission region and the pull-down region of the first combination region, and on the transmission region and the pull-down region of the second combination region;

the second initial fins are respectively on the pull-up region of the first combination region and the pull-up region of the second combination region, the second initial fins of the first combination region extends to a pull-up fin cutting region of the second combination region, the second initial fins of the second combination region extends to the pull-up fin cutting region of the first combination region;

transmission gate structures and pull gate structures are respectively on both sides of the first cutting layer, the transmission gate structures are on the transmission region of the first combination region and the pull gate structures are on the pull-down region and the pull-up region of the second combination region, or, the transmission gate structures are on the transmission region of the second combination region and the pull gate structures are on the pull-down region and the pull-up region of the first combination region; and the second fins are respectively on the pull-up region of the first combination region and the pull-up region of the second combination region, the second fins of the first combination region are on a side of the pull-up fin cutting region of the second combination region in the extending direction of the second fin, the second initial fins of the second combination region extend to the pull-up fin cutting region of the first combination region, and the second fins of the second combination region are on a side of the pull-up fin cutting region of the first combination region in the extending direction of the second fins.

3. The method according to claim 1, wherein forming the first cutting layer, comprises:

removing the initial gate structures at a bottom of the mask opening;

forming a first cut opening in the initial gate structures;

exposing part of top surfaces of the second initial fins at a bottom of the first cut opening;

forming transmission gate structures and pull gate structures on both sides of the first cutting opening from the initial gate structures; and forming the first cutting layer in the first cutting opening.

4. The method according to claim 3, further comprising:

when forming the first cutting layer, forming a mask sidewall on a sidewall of the mask opening, in the extending direction of the second initial fins, a minimum distance between the mask sidewall and the first cutting layer being equal to zero.

5. The method according to claim 4, wherein forming the first cutting layer and the mask sidewall, further comprises:

forming a first cutting film in the first cutting opening, and on a sidewall and at a bottom of the mask opening; and etching back the first cutting film to form the first cutting layer and the mask sidewall.

6. The method according to claim 5, wherein forming the first cutting film includes an atomic layer deposition process.

7. The method according to claim 5, wherein a material of the first cutting layer includes silicon nitride, aluminum oxide, silicon carbide, aluminum nitride, or a combination thereof.

8. The method according to claim 4, wherein forming the second cutting layer, comprises:

etching the dielectric layer and the second initial fins at a bottom of the mask opening by using the first cutting layer and the mask layer as etch masks;

forming the second cutting opening on the pull-up fin cutting region in the second initial fins and the dielectric layer;

cutting the second initial fins in the second cutting opening in the extending direction of the second initial fins, so that the second fins on a side of the second cutting opening are formed from the second initial fins; and forming the second cutting layer in the second cutting opening.

9. The method according to claim 8, further comprising:

removing the mask layer after the second cutting opening is formed and before the second cutting layer is formed in the second cutting opening.

10. The method according to claim 1, wherein the first cutting layer is formed after the second cutting layer is formed.

11. The method according to claim 1, wherein the second cutting layer is formed after the first cutting layer is formed.

12. The method according to claim 1, wherein a material of the second cutting layer includes silicon nitride, aluminum oxide, silicon carbide, aluminum nitride, or a combination thereof.

13. A SRAM memory, comprising:

a semiconductor substrate including memory cell regions, each memory cell region including a transmission region, a pull-down region, and a pull-up region including a pull-up fin cutting region;

first fins on the transmission region and the pull-down region;
second fins on the pull-up region, the seconds fins being on a side of the pull-fin cutting region in the extending direction of the second fins;
transmission gate structures across the first fins, the transmission gate structures being on the transmission region;
pull gate structures on the pull-down region and the pull-up region;
a first cutting layer between the transmission gate structures and the pull gate structures along the extension direction of the transmission gate structures, the first cutting layer spanning the second fins; and
a second cutting layer on the pull-up fin cutting region, the second cutting layer being adjacent to sidewalls of the first fins along the extending direction of the first fins, the second cutting layer being adjacent to the first cutting layer.

14. The SRAM memory according to claim 13, wherein:
each memory cell region includes a first combination region and a second combination region that are symmetrical in the center, and each of the first combination region and the second combination region includes a transmission region, a pull-down region, and a pull-up region;
the first fins are respectively on the transmission region and the pull-down region of the first combination region, and on the transmission region and the pull-down region of the second combination region;
the second fins are respectively on the pull-up region of the first combination region and the pull-up region of the second combination region, the second fins of the first combination region are on a side of the pull-up fin cutting region of the second combination region in the extension direction of the second fins, the second fins of the second combination region is on the side of the pull-up fin cutting region in the first combination region in the extension direction of the second fins;
the transmission gate structures are respectively on the transmission region of the first combination region and on the transmission region of the second combination region;
the pull gate structures are respectively on the pull-down region and the pull-up region of the first combination region, and on the pull-down region and the pull-up region of the second combination region;
the first cutting layer is respectively between the transmission gate structure of the first combination region and the pull gate structure of the second combination region, and between the transmission gate structure of the second combination region and the pull gate structure of the first combination region; and
the second cutting layer is on the pull-up fin cutting region of the first combination region and on the pull-up fin cutting region of the second combination region.

15. The SRAM memory according to claim 13, wherein a material of the first cutting layer includes silicon nitride, aluminum oxide, silicon carbide, aluminum nitride, or a combination thereof.

16. The SRAM memory according to claim 13, wherein a material of the second cutting layer includes silicon nitride, aluminum oxide, silicon carbide, aluminum nitride, or a combination thereof.

17. The SRAM memory according to claim 13, wherein in the extending direction of a second fin, a size of an overlapping region of the first cutting layer and the second fin is equal to a size of the first cutting layer.

* * * * *